United States Patent [19]

Fitzpatrick

[11] Patent Number: 5,500,147
[45] Date of Patent: Mar. 19, 1996

[54] SCINTILLATION SOLID AND METHOD OF MEASURING RADIATION

[75] Inventor: Brian J. Fitzpatrick, Ossining, N.Y.

[73] Assignee: Optical Semiconductors, Inc.

[21] Appl. No.: 966,946

[22] Filed: Oct. 27, 1992

[51] Int. Cl.$^6$ ...................................................... C09K 11/54
[52] U.S. Cl. ............................ 252/301.6 S; 252/301.4 R; 252/301.4 S; 252/301.6 R
[58] Field of Search ..................... 252/301.4 R, 301.4 S, 252/301.6 R, 301.6 S

[56] References Cited

U.S. PATENT DOCUMENTS 4,499,005  2/1985  McColl et al. .................. 252/301.6 R
5,032,316  7/1991  Takahashi et al. ................ 252/301.6 R Primary Examiner—Richard D. Lovering
Assistant Examiner—Catherine Kilby Scalzo
Attorney, Agent, or Firm—David M. McConoughey

[57] ABSTRACT

A monolithic solid scintillation body with a monocrystalline or polycrystalline morphology having generally constant luminescence from about 25° C. to at least about 200° C. and average crystal domain grain diameters of at least about 5 millimeters and being composed of zinc sulfide doped with copper and a method of measuring radiation using the scintillation body and an apparatus for measuring radiation are disclosed.

12 Claims, 1 Drawing Sheet

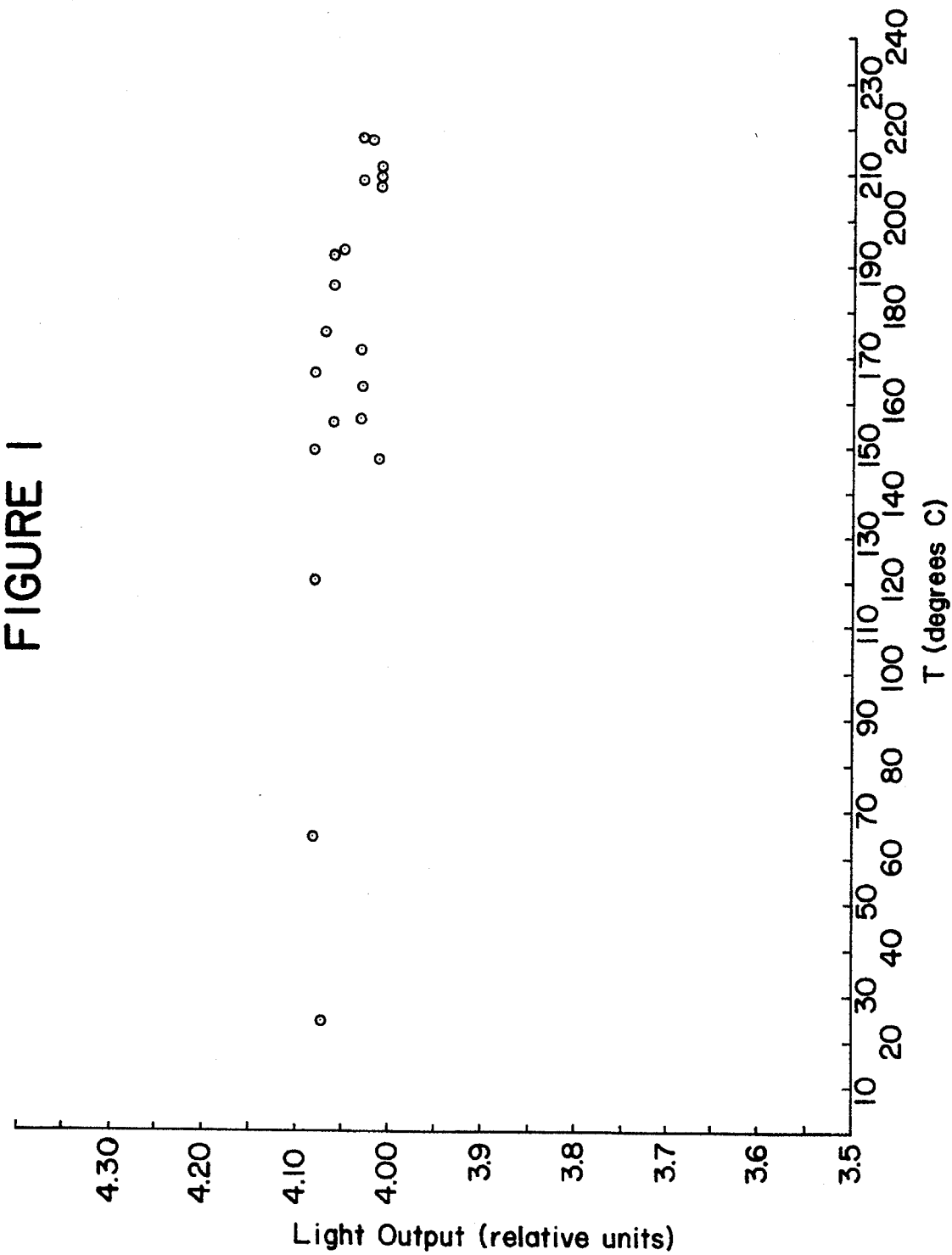

SCINTILLATION SOLID AND METHOD OF MEASURING RADIATION

BACKGROUND OF THE INVENTION

The invention relates to scintillation materials for use in radiation detectors operating under adverse temperature conditions.

Radiation detectors based on scintillation detectors are used, for example, in logging petroleum and geothermal deposits by γ-ray detection or in monitoring nuclear power installations. These detectors, and the scintillation materials they use, must operate in adverse chemical and temperature environments, such as the brine-saturated, super-heated steam contaminated with volatile sulfur compounds found in association with geothermal deposits. The typical operating environment for such a scintillation material is from about 25 degrees Celsius to about 200 degrees Celsius or more.

Scintillation materials used in the past lose their efficiency as temperature increases. For example, thallium-activated sodium iodide loses efficiency at the rate of minus 0.2% per degree Celsius temperature rise and bismuth orthogermanate ($Bi_4Ge_3O_{12}$) loses 2% per degree Celsius. At room temperature bismuth orthogermanate has a light output of only 8% of the output of thallium-activated sodium iodide and at 125 degrees Celsius its light output is 20% of the output that it has at room temperature.

SUMMARY OF THE INVENTION

It is an object of the present invention to provide an improved solid scintillation body.

It is a further object of the invention to provide a solid scintillation body that does not lose efficiency over the temperature range from about 25 degrees Celsius to about 200 degrees Celsius.

The invention provides a monolithic monocrystalline or polycrystalline solid scintillation body with a monocrystalline or polycrystalline morphology having generally constant luminescence from about 25° C. to at least about 200° C. and average crystal domain grain diameters of at least about 5 millimeters and being composed of zinc sulfide doped with copper. It also provides a method of measuring radiation that comprises (a) subjecting a monolithic solid scintillation body with a monocrystalline or polycrystalline morphology having generally constant luminescence from about 25° C. to at least about 200° C. and average crystal domain grain diameters of at least about 5 millimeters and being composed of zinc sulfide doped with copper to incident radiation at an ambient temperature from about 25° C. to at least about 200° C. to thereby cause the emission of scintillation photons and (b) detecting said scintillation photons.

BRIEF DESCRIPTION OF THE DRAWING

FIG. 1 is a graph of temperature (in degrees Celsius) versus light output in relative units.

DESCRIPTION OF THE PREFERRED EMBODIMENTS

The scintillation body of the invention is a monolithic solid and is to be distinguished from a powder or a bulk form of compressed powder, which are never sufficiently translucent to be efficient scintillators for most applications. The monolithic solid may be a single crystal or may be composed of many crystal domains within the monolith, i.e., it may have a monocrystalline or polycrystalline morphology. The crystal domains should have an average grain diameter of at least 5 millimeters and desirably from about 5 millimeters to about 25 millimeters and preferably from about 10 millimeters to about 25 millimeters. In this context, grain diameter means the average transverse dimension of the grain. Desirably the scintillation body is transparent or at least translucent so that it can transmit scintillation photons.

The scintillation body is composed of a scintillation material having high scintillation efficiency 10% or greater and that retains that high efficiency even under extreme operating temperatures, e.g. at least up to about 200 degrees Celsius. Further, the material retains a relatively constant efficiency and luminescence over a wide temperature range, i.e., from about 25 degrees Celsius to the aforesaid extreme operating temperatures (at least up to about 200 degrees Celsius) and desirably from about 25 degrees Celsius to about 220 degrees Celsius and preferably from about 25 degrees Celsius to about 260 degrees Celsius. In this context, the material should lose no more than about 3% of its luminescence scintillation efficiency ("scintillation efficiency") over this entire operating temperature range. The preferred scintillation material is zinc sulfide doped with copper, although alloys of zinc sulfide with cadmium sulfide would also be useful. The copper dopant may be present in the scintillation body from about 0.3 parts per million based on the weight of the body to about 100 parts per million, desirably from about 0.6 parts per million to about 30 parts per million and preferably from about 0.6 parts per million to about 10 parts per million.

In the invention the copper dopant is generally uniformly and randomly distributed within the crystal lattice of the zinc sulfide material within each crystal domain. While a greater or lesser concentration of dopant may occur at the bottom tip or the top surface of a boule during manufacture because of dopant segregation, this phenomenon is not germane here since either end of the boule may be readily removed from the boule in making the scintillation body or the end need not be used for scintillation. Uniform distribution of dopant within each grain is desirable, however.

It is desirable to minimize any haze in the monolithic body and to reduce grain boundaries so as not to adversely affect efficiency. It is also desirable that scattering centers such as precipitates and bubbles be minimized.

The monolithic body of the invention may be produced by the method described in U.S. Pat. No. 4,456,546 to Fitzpatrick and McGee, Fitzpatrick et al., Philips J. of Research, 41, 452 et seq. (1986), and Fitzpatrick et al., Journal of Crystal Growth V. 78, pp. 242–248 (1986), the disclosures of which are incorporated herein by reference.

The scintillation body may be used in measuring radiation by (a) subjecting a monolithic solid scintillation body with a monocrystalline or polycrystalline morphology having generally constant luminescence from about 25° C. to at least about 200° C. and average crystal domain grain diameters of at least about 5 millimeters and being composed of zinc sulfide doped with copper to incident radiation at an ambient temperature from about 25° C. to at least about 200° C. to thereby cause the emission of scintillation photons and (b) detecting said scintillation photons. The operating temperatures for taking these measurements are as previously described. The scintillation photons may be detected by suitable detection means such as a photomultiplier, a diode array, a charge coupled device or a vidicon device. The scintillation body of the invention may be incorporated into an apparatus for measuring radiation comprising (a) a monolithic solid scintillation body with a monocrystalline or polycrystalline morphology having generally constant luminescence scintillation efficiency from about 25° C. to at least about 200° C. and average crystal domain grain diameters of at least about 5 millimeters and being composed of zinc sulfide doped with copper and (b) a detector for detecting scintillation photons emitted by said scintillation body.

The following example is provided to illustrate various aspects of the invention and is not intended as being limiting.

EXAMPLE

A charge of about 125 g. of zinc sulfide powder along with 0.67 mg. copper metal as a dopant was loaded into a crucible similar to that shown in Fitzpatrick et al., Philips J. of Research, 41, 452 et seq. (1986) and Fitzpatrick et al., Journal of Crystal Growth V. 78, pp. 242–248 (1986). The 51 mm diameter crucible was placed inside an RF induction heating coil inside a pressure chamber (Arthur D. Little, Cambridge, Mass.) filled with 10 atmospheres of nitrogen.

A current of 270 amperes was used in the induction coil throughout the run in order to initiate and maintain the molten zone; after 20 minutes, the crucible was lowered through the coil at 25.4 mm/hour. Crucible rotation at 10 rpm was used to promote uniformity. After the crucible had passed through the coil, the power was reduced gradually to zero and the crucible was removed from the furnace.

A boule of copper-doped, zinc sulfide (3.5 inches long) was produced. The bottom 2.5 inches showed strong green luminescence. The boule was cleaved into sections (about 1 $cm^3$.) suitable for measuring the luminescence. Luminescence or light output was measured by heating a section on a hot plate and measuring the temperature of the section with a surface thermocouple with the section and the thermocouple sitting at thermally equivalent points on the hotplate itself. The section was irradiated with ultra violet light of 365 nanometers and the light output was measured with a Minolta F3 light meter using a Vivitar light green filter to block any scattered 365 nanometer radiation.

FIG. 1 plots the data obtained and shows the light output of the section over the temperature range of 24° C. to 217° C. The light output values range from a maximum value of 4.08 to a minimum of 4.01 and show a variation in light output values of less than 3%.

The efficiency and luminesce of the monolithic bodies of the invention are generally independent of temperature and remain generally constant over a wide temperature range. The advantage of retaining relatively constant efficiency and luminescence is that the scintillator does not lose detection efficiency under adverse high temperature conditions and that its response is not only linear but is relatively constant so that there need not be any compensation for temperature drift. Owing to their chemical composition the scintillation bodies of the invention are resistant to the chemical environments in which scintillation measurements are taken. The monolithic bodies of the invention have application in the fields of petroleum and geothermal deposit well and borehole logging and nuclear powerplant monitoring as well as nuclear weapons detection, radioactive waste monitoring and industrial inspection.

While the present invention has been described with respect to certain particular embodiments thereof, it is apparent that numerous other forms and modifications of this invention will be obvious to those skilled in the art. The appended claims and this invention generally should be construed to cover all forms and modifications that are within the true spirit and scope of the present invention.

I claim:

1. A monolithic solid scintillation body with a monocrystalline or polycrystalline morphology having generally constant luminescence scintillation efficiency from about 25° C. to at least about 200° C. and average crystal domain grain diameters of at least about 5 millimeters and being composed of zinc sulfide doped with copper.

2. A scintillation body as defined by claim 1 wherein the copper concentration is from about 0.3 parts per million based on the weight of the zinc sulfide to about 100 parts per million.

3. A scintillation body as defined by claim 1 wherein the copper concentration is from about 0.6 parts per million based on the weight of the zinc sulfide to about 30 parts per million.

4. A scintillation body as defined by claim 1 wherein the copper concentration is from about 0.6 parts per million based on the weight of the zinc sulfide to about 10 parts per million.

5. A scintillation body as defined by claim 1 wherein the body has generally constant luminescence from about 25° C. to at least about 220° C.

6. A scintillation body as defined by claim 1 wherein the body has a generally constant luminescence from about 25° to about 260° C.

7. A scintillation body as defined by claim 1 wherein the body has a scintillation efficiency of at least 10%.

8. A scintillation body as defined by claim 1 wherein the copper is uniformly distributed within each crystal domain grain.

9. A scintillation body as defined by claim 1 wherein the body further includes an alloy of zinc sulfide with cadmium sulfide.

10. A scintillation body as defined by claim 1 wherein the scintillation efficiency of said body varies no more than about 3% over the temperature range from about 25° C. to about 220° C.

11. A method of measuring radiation comprising
  a. subjecting a monolithic solid scintillation body with a monocrystalline or polycrystalline morphology having generally constant luminescence scintillation efficiency from about 25° C. to at least about 200° C. and average crystal domain grain diameters of at least about 5 millimeters and being composed of zinc sulfide doped with copper to incident radiation at an ambient temperature from about 25° C. to at least about 200° C. to thereby cause the emission of scintillation photons and
  b. detecting said scintillation photons.

12. An apparatus for measuring radiation comprising
  a. A monolithic solid scintillation body with a monocrystalline or polycrystalline morphology having generally constant luminescence scintillation efficiency from about 25° C. to at least about 200° C. and average crystal domain grain diameters of at least about 5 millimeters and being composed of zinc sulfide doped with copper and
  b. a detector for detecting scintillation photons emitted by said scintillation body.

* * * * *